(12) United States Patent
Chow et al.

(10) Patent No.: US 7,524,768 B2
(45) Date of Patent: Apr. 28, 2009

(54) METHOD USING MONOLAYER ETCH MASKS IN COMBINATION WITH PRINTED MASKS

(75) Inventors: Eugene M. Chow, Freemont, CA (US); William S. Wong, San Carlos, CA (US); Michael Chabinyc, Burlingame, CA (US); Jeng Ping Lu, San Jose, CA (US); Ana Claudia Arias, San Carlos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 510 days.

(21) Appl. No.: 11/388,718

(22) Filed: Mar. 24, 2006

(65) Prior Publication Data

US 2007/0221610 A1 Sep. 27, 2007

(51) Int. Cl.
*H01L 21/302* (2006.01)
(52) U.S. Cl. .................... 438/706; 438/725; 216/74
(58) Field of Classification Search .......... 438/706, 438/710, 714, 719, 720, 723, 725; 216/67, 216/74, 75, 77, 78, 79
See application file for complete search history.

(56) References Cited

U.S. PATENT DOCUMENTS

| 4,690,715 | A | 9/1987 | Allara et al. |
| 4,964,945 | A | 10/1990 | Calhoun |
| 5,900,160 | A | 5/1999 | Whitesides et al. |
| 6,180,239 | B1 | 1/2001 | Whitesides et al. |
| 6,742,884 | B2 | 6/2004 | Wong et al. |
| 6,872,320 | B2 | 3/2005 | Wong et al. |
| 6,972,261 | B2 | 12/2005 | Wong et al. |
| 2002/0154187 | A1 | 10/2002 | Wong et al. |
| 2003/0027082 | A1 | 2/2003 | Wong et al. |
| 2004/0002225 | A1* | 1/2004 | Wong et al. .......... 438/745 |
| 2006/0057851 | A1* | 3/2006 | Wong et al. .......... 438/694 |
| 2007/0145002 | A1* | 6/2007 | Street .................. 216/2 |
| 2007/0221611 | A1* | 9/2007 | Chow et al. ............ 216/13 |
| 2007/0277685 | A1* | 12/2007 | James ................. 101/114 |
| 2008/0121884 | A1* | 5/2008 | Wong et al. ............ 257/57 |

OTHER PUBLICATIONS

U.S. Appl. No. 11/184,304, filed Jul. 18, 2005, Arias, et al.
U.S. Appl. No. 11/193,847, filed Jul. 28, 2005, Wong, et al.

(Continued)

*Primary Examiner*—Kin-Chan Chen
(74) *Attorney, Agent, or Firm*—Fay Sharpe LLP

(57) ABSTRACT

A method to pattern films into dimensions smaller than the printed pixel mask size. A printed mask is deposited on a thin film on a substrate. The second mask layer is selectively deposited onto the film, but not to the printed mask. A third mask is then printed onto the substrate to pattern a portion of the second mask. Certain solvents are then used to remove the printed mask but not the mask layer on the thin film. The mask layer is then used to form a pattern on the thin film in combination with etching. The features formed in the thin film are smaller than the smallest dimension of the printed mask. The coated mask layer can be a self-assembled mono-layer or other material that selectively binds to the thin film.

19 Claims, 18 Drawing Sheets

OTHER PUBLICATIONS

U.S. Appl. No. 11/388,731, filed Mar. 24, 2006, Chow, et al.
W. S. Wong, et al., "Amorphous silicon thin-film transistors and arrays fabricated by jet printing", Appl. Phys. Lett., 80, 610 (2002).
Mikami, Yoshiro, et al. "A New Patterning Process Concept for Large-Area Transistor Circuit Fabrication Without Using an Optical Mask Aligner", IEEE Transactions on Electron Devices, 41, 306 (1994).
Biercuk, M. J., et al. Low-temperature atomic-layer-deposition lift-off method for microelectronic and nanoelectronic applications, Appl. Phys. Lett., 83, 2405 (2003).
Delamarche, Emmanuel, et al., "Electroless Deposition of NiB on 15 Inch Glass Substrates for the Fabrication of Transistor Gates for Liquid Crystal Displays", American Chemical Society, 2003.

* cited by examiner

METHOD USING MONOLAYER ETCH MASKS IN COMBINATION WITH PRINTED MASKS

This invention was made with United States Government support under Cooperative Agreement Number 70NANB3H3029 awarded by the National Institute of Standards and Technology (NIST). The United States Government has certain rights in the invention.

CROSS REFERENCE TO RELATED PATENTS AND APPLICATIONS

The following applications, the disclosures being totally incorporated herein by reference are mentioned:

U.S. application Ser. No. 11/388,731, filed contemporaneously herewith, entitled "METHOD OF MANUFACTURING SMALL GATES FOR THIN FILM TRANSISTORS," by Eugene M. Chow, et al.; and U.S. application Ser. No. 11/193,847, entitled "PATTERNED-PRINT THIN-FILM TRANSISTORS WITH TOP GATE GEOMETRY," by William S. Wong, et al.

BACKGROUND

In recent years, backplanes over large areas with actively addressed thin-film transistors (TFTs) have found important applications in the production of pixelated devices such as image capturing devices, display devices, and sensor devices. In recent years, the increasingly widespread use of display device alternatives to the cathode ray tube (CRT) has driven the demand for large-area electronic arrays for displays. In particular, active matrix addressed liquid crystal displays are commonly used in lap-top computers and for televisions. However, fabricating such large-area TFT arrays is expensive. A large part of the fabrication cost of the large-area TFT arrays arises from the photolithographic process used to pattern the array. In order to avoid such photolithographic processes, direct marking techniques have been considered as an alternative to photolithography.

Examples of direct marking techniques used in place of photolithography include utilizing a xerographic process to deposit a toner that acts as an etch mask, gravure printing of a mask material and using an ink-jet printhead to deposit a liquid mask. These techniques have corresponding problems. Toner-based materials are hard to control and difficult to remove after deposition. Controlling the feature size of materials printed using gravure techniques is difficult due to spreading of the printed liquid on the layer to be patterned.

The use of ink-jetted liquids to directly write etch masks is a practical alternative to printed toner although jet printing also possesses inherent complexities. Controlling the feature sizes of printed liquid masks is difficult due to spreading of the liquid on the surface after deposition. For example, when liquid drops are deposited onto a surface, the droplet configuration is largely determined by its wetting properties. Typically, small wetting or contact angles (the angle formed by the edge of a droplet and the substrate surface) are required to obtain good adhesion to a surface but this condition allows the liquid to spread and form relatively large features. On the other hand, if the liquid does not wet the surface due to a high surface energy, a large contact angle will form allowing for the formation of small drop features. However, these printed droplets may adhere poorly. Neither situation is desirable in semiconductor processing—the small contact angle droplets increase feature size while large contact angle droplets give unreliable patterning.

Special piezoelectric ink-jet printheads allow generation of low droplet volumes. Small printed features have been obtained using ink-jet printheads as described in W. S. Wong, et al., "Amorphous silicon thin-film transistors and arrays fabricated by jet printing" in Applied Physics Letters, Vol. 80, pp. 610-612 (2002). In the described reference, wax etch masks patterned by ink-jet printing are used to produce feature sizes on the order of 20-40 microns with layer registration to within a few micrometers. However, even with these printheads, the small sizes of features critical to the fabrication of large-area microelectronic arrays have been difficult to achieve. In using a jet-printed feature as an etch mask, the minimum feature size was limited by the smallest droplet, typically in the range of 20 microns.

In many cases, the use of a smaller feature in the backplane circuit can improve its performance. The use of a smaller gate electrode can reduce the resistance of a TFT in its on-state and decrease its overall capacitance. The use of smaller source and drain electrodes can also reduce the overall capacitance of a TFT. Reduction in the size of the address lines to the source/drain of a plurality of TFTs in a backplane circuit can improve the fill factor of backlit liquid crystal displays and reduce their capacitive coupling to underlying gate address lines. One possible solution is metal liftoff using a printed mask using a phase change material such as wax. This involves depositing metal on the entire wafer after a wax mask is deposited, including on top of the mask. The mask is then removed chemically (dissolved in solvent), removing the metal above the mask but leaving the metal between the original mask features. Cracks in the metal around the mask allow solvent to attach the mask material through the metal. However, in some manufacturing processes, liftoff may not be the best solution for fabrication of fine features. Removal of the metal in a bath creates a particle-laden solution that can leave particulates on the surface of the substrate reducing yield in some cases.

Thus, a method of forming smaller features, such as small gate electrodes and small source and drain electrodes for thin film transistors, using inexpensive printing techniques is needed.

INCORPORATION BY REFERENCE

The following reference, the disclosure of which is incorporated by reference in its entirety, relates to a method and apparatus for fabricating small feature devices using materials from aqueous or non-aqueous organic solutions: U.S. Pat. No. 6,972,261 issued to Wong, et al., entitled METHOD FOR FABRICATING FINE FEATURES BY JET-PRINTING AND SURFACE TREATMENT.

BRIEF DESCRIPTION

A method to pattern films into dimensions smaller than the smallest dimension of a printable mask size is presented. First, a mask is printed onto a thin film on a substrate. The substrate is then dipped into a solution or exposed to a vapor that deposits a second mask layer that binds selectively to the thin film, but not to the printed mask. A second printed mask is then used to define fine features smaller then the fine features of the first printed mask by printing with registration to the first printed mask. The exposed regions of the second mask bound to the film are then removed. Certain solvents are then used to remove the printed masks but not the second mask layer on the thin film. The second mask layer is then used to form a pattern on the thin film in combination with etching. The features formed in the thin film are smaller than the minimum dimension of the printed mask. The second deposited mask layer can be a self-assembled mono-layer or other material that selectively binds to the thin film.

In one embodiment, a method of patterning a feature on a substrate is provided. The method comprises depositing a thin film layer on a substrate, printing a first mask to form a fine feature where the fine feature is a gap with a distance smaller then the minimum printed mask dimension, depositing a second mask around the first mask and on top of the thin film layer, printing a third mask registered to the first mask to define a region of the second mask that is smaller than the smallest region of the first mask, removing the exposed portions of the second mask, removing the first and third masks relative to the remaining portions of the second mask, and removing areas of the thin film layer not protected by the remaining second mask.

In another embodiment, a method of fabricating an electronic device with fine features is provided. The method comprises depositing a thin film layer on a substrate, printing a first mask to form a fine feature where the fine feature is a gap with a distance smaller then the minimum printed mask dimension, depositing a second mask around the first mask and on top of the thin film layer, printing a third mask registered to the first mask to define a region of the second mask that is smaller than the smallest region of the first mask, removing the exposed portions of the second mask, removing the first and third masks relative to the remaining portions of the second mask, removing portions of the thin film layer not protected by the second mask, removing the remaining portions of the second mask, and forming at least one electrical component of an electronic device.

In yet another embodiment, a method of making a portion of a thin film transistor array is provided. The method comprises depositing a thin film layer on a substrate, printing a first mask to form a fine feature where the fine feature is a gap with a distance smaller then the minimum printed mask dimension, depositing a second mask around the first mask and on top of the thin film layer, printing a third mask registered to the first mask to define a region of the second mask that is smaller than the smallest region of the first mask, removing the exposed portions of the second mask, removing the first and third masks relative to the remaining portions of the second mask, removing regions of the thin film layer not protected by the second mask, and removing the remaining portions of the second mask.

DETAILED DESCRIPTION

In the following detailed description a method using mono-layer etch masks in combination with jet-printed masks is presented. The method may use the system described below for creating a pattern, typically using a printer to controllably eject individual droplets to form a patterned protective layer or coating over regions of the substrate to define the outline of a feature. Of course, it is to be understood that other suitable printing systems may be used, such as gravure or flexographic printing, and other methods for controlling jet-printed features could be used, such as printing variable sizes of drops. Regions that were not at one time covered by protective layer will be subject to deposition (or removal) of materials used to form various features. Thus, feature size will not be limited by droplet size, but instead by how closely droplets can be aligned and printed onto the substrate relative to each other. A system to tightly control the boundaries of the droplet and minimize possible coalescence of juxtaposed droplets will also be described.

Figure 1:
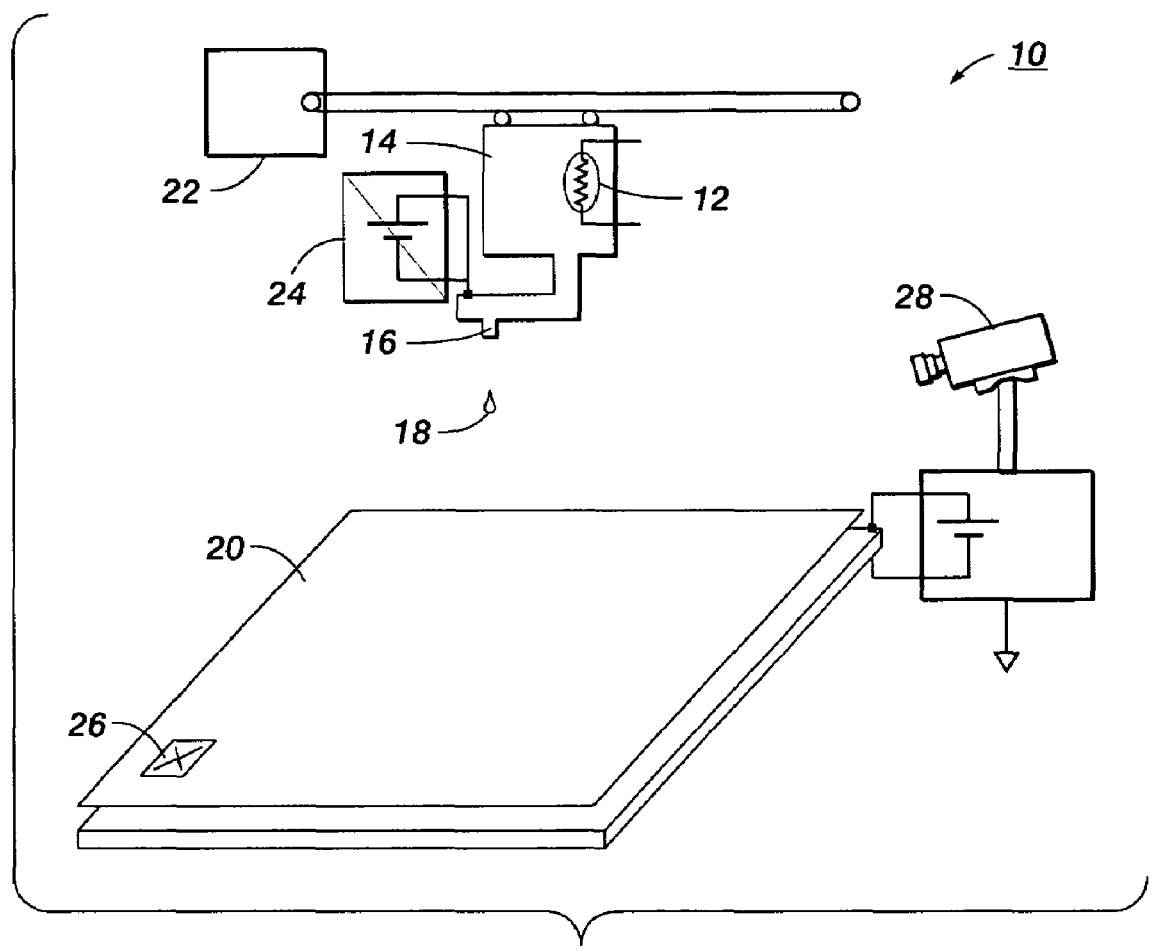
FIG. 1 shows a droplet source system used to eject a phase-change material onto a substrate.

A system suitable for implementing the embodiments of the method set forth herein is described in U.S. Pat. No. 6,972,261, Wong, et al., for example. FIG. 1 shows the relevant components of a system 10, which includes a heat source 12 that heats a reservoir 14 of typically phase-change material to a temperature that is sufficient to maintain the material in a liquid state. The temperature of the reservoir is generally maintained above 50 degree centigrade and, in some situations, at temperatures above 100 degrees centigrade, a temperature sufficient to liquefy many organic materials that are in the solid phase near room temperature.

The phase-change material may be an organic material that melts at temperatures higher than room temperature. Other desirable characteristics of the phase-change material include that the patterning material is non-reactive with organic and inorganic materials used in typical semiconductor materials processing, and that the phase change material has a high selectivity to etchants. When liquid suspension is used, the substrate material is maintained above the boiling point of the liquid, and after deposition of the patterning material, the liquid carrier evaporates upon contact with the substrate surface. When evaporation is used, the phase change process is directed from liquid to vapor, rather than from liquid to solid.

An additional desirable characteristic of the phase-change patterning material is that the resulting pattern should be robust enough to withstand wet-chemical or dry etching processes. When a dry etching process is used, phase change patterning materials with low-vapor pressures may be used. Wax is an example of a phase-change material with the previously described characteristics. Kemamide 180-based waxes from Crompton Corporation of Middlebury, Conn. are but one example of a suitable wax for use as a phase-change patterning material.

In this system, a plurality of droplet sources such as droplet source 16 receives the liquid phase-change marking material from reservoir 14 and outputs droplets 18 for deposition on a substrate 20. The substrate 20 is maintained at a temperature such that the droplet cools rapidly after deposition.

When increased coalescence between adjacent droplets is required, the substrate temperature can be increased to increase droplet spreading and thereby increase coalescence. When printing lines of Kemamide-based wax from an acoustic ink-jet printer, it has been found that increasing the substrate temperature from 30 degrees to 40 degrees centigrade improves the print quality of the pattern. In the case of Kemamide-based waxes, it has been found that excellent results are achieved when the surface is maintained at 40 degrees centigrade, which is about 20 degrees centigrade below the freezing point of the wax. At 40 degrees centigrade, the temperature of the substrate is still low enough that the droplet rapidly "freezes" upon contacting substrate 20.

After a droplet of marking material is deposited on the substrate 20, the relative positions of the substrate 20 and the droplet source 16 are adjusted to reposition the droplet source 16 over a second position to be patterned. The repositioning operation may be achieved either by moving the droplet source 16 or by moving the substrate 20. As shown in FIG. 1, a control circuit 22 moves the droplet source 16 in a predetermined pattern over the substrate 20. A driver circuit 24 provides energy to the droplet source 16, causing ejection of droplets when the droplet source 16 is positioned over a region of the substrate 20 to be patterned. By coordinating the movement of the droplet source 16 with the timing of droplet source outputs, a pattern can be "printed" on the substrate 20.

The phase change material is generally a solid at temperatures below approximately 60 degrees centigrade. Thus, it may be unnecessary to cool the substrate 20 below room temperature because as previously described, a sufficiently small droplet cools rapidly when a degree temperature differential is maintained between the freezing point of the phase change material and the substrate temperature. In such cases, the temperature control circuit may merely be a sensor and a heater that raises the substrate slightly above room temperature when larger feature sizes are to be printed.

In order to control and align the movement of the droplet source 16, printed alignment marks, such as mark 26, patterned from a previous patterned layer may be used to coordinate the next overlying layer. An image processing system such as a camera 28 may be used to capture the orientation of the previous patterned layer. A processing system then adjusts the position of the overlying pattern layer by altering the pattern image file before actual printing of the pattern layer. In this way, the substrate 20 remains fixed and mechanical movement of the substrate holder is unnecessary. Instead positioning adjustment are accomplished in software and translated to movements of the droplet source 16.

Each droplet source may be implemented using a variety of technologies including traditional ink-jet technology. An alternative technology well suited for generating extremely small droplet sizes is the use of sound waves to cause ejection of droplets of patterning material as done in acoustic ink printing systems, as described in, for example, U.S. Pat. No. 6,972,261, Wong et al.

Figure 2A:
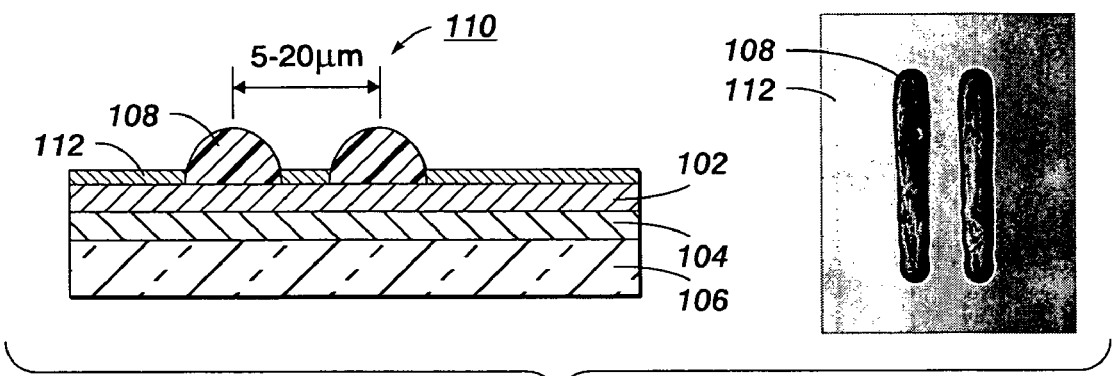
FIGS. 2A-2C show a schematic side view of the formation of a portion of a thin film transistor and top view photographic images of the transistor at the corresponding process steps according to aspects of the exemplary embodiment.
Figure 2B:
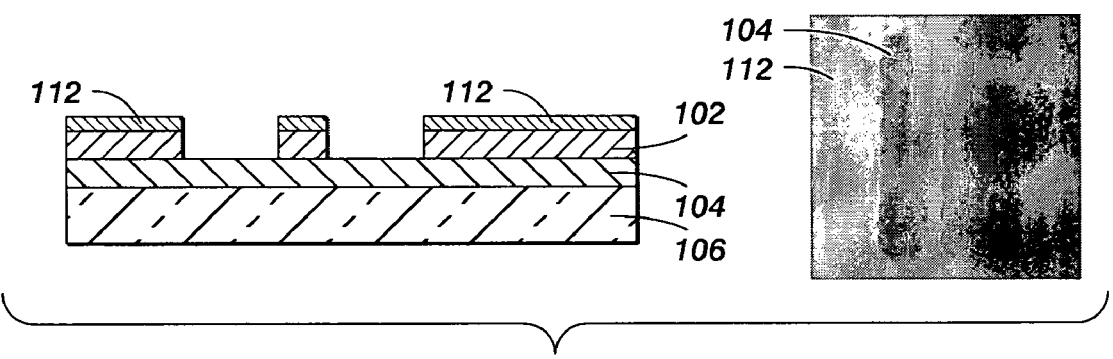
Figure 2C:
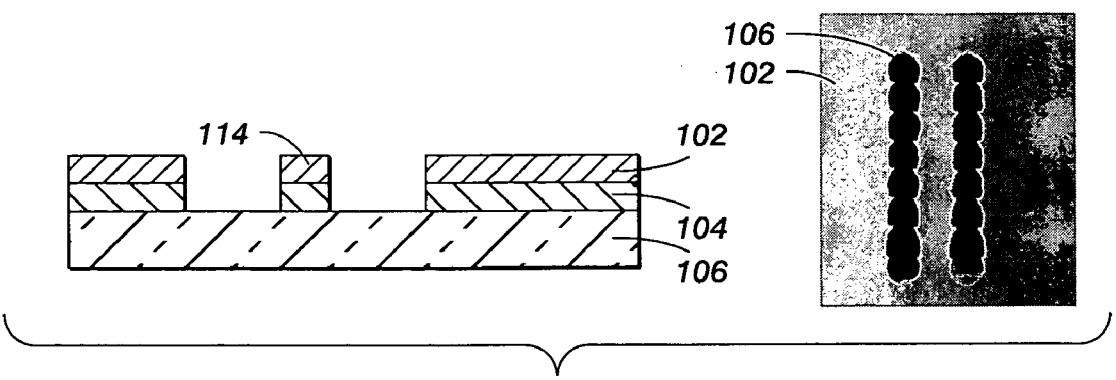

FIGS. 2A-2C show a cross-sectional view of a thin film transistor (TFT) at various stages in a process to form fine features such as gates and describes an operation used to fabricate fine features. Top view images of the fabricated TFT at the corresponding process step are shown on the right. As used herein, fine features are defined as features that have a dimension that is smaller than the smallest dimension of a printed mask feature. For example, the smallest width of a line printed using phase change materials is approximately 30 microns; in this case a fine feature would have a dimension typically in the range of 1 to 30 microns. With reference to FIG. 2A, a thin film 102 and its adhesion layer 104 (if required) are deposited onto a substrate 106. For example, titanium or chrome are typical adhesion layers for subsequent deposition of gold. Standard deposition techniques can be used, such as sputtering or evaporation, to deposit the thin film. Optionally, the thin film could function as a seed layer for growing a film, such as gold, using a growth technique such as electroplating or electroless plating. Examples of typical substrates include glass, polymers, such as poly(ethyleneterephthalate), or stainless steel.

A printing apparatus, such as the printing apparatus of FIG. 1, ejects droplets of a protective material in a pattern resulting in a first patterned protective mask 108 over the thin film layer 102. The protective material may be made of a variety of materials, typically materials that solidify reasonably soon after contact to minimize absorption into the substrate. The protective material may be deposited using a variety of techniques. One method of deposition is described in U.S. Pat. No. 6,742,884 to Wong et al., entitled "APPARATUS FOR PRINTING ETCH MASKS USING PHASE-CHANGE MATERIALS", and U.S. Pat. No. 6,872,320 Wong et al., entitled METHOD FOR PRINTING ETCH MASKS USING PHASE-CHANGE MATERIALS," the disclosures of which are hereby incorporated by reference in their entirety. The rapidly solidifying protective material may be made from a number of different compounds. One example of a suitable protective material is the previously described wax compound such as Kemamide 180-based wax from Crompton Corporation of Middlebury, Conn.

The deposited pattern includes a small gap 110 in the first protective mask 108 that will allow for fine features to be fabricated within the gap 110. The minimum dimension of the gap 110 in the first protective mask 108 defines the resolution of the feature(s) to be fabricated. In this case, the gap 110 is between 5 and 20 microns wide. Smaller gaps are possible, particularly if smaller printed drops are used or drops with very reproducible dimensions with precise and accurate placement of the droplets from the printhead. Next, the entire substrate 106 is dipped into a solution which deposits a monolayer mask 112 such as alkanethiol on the exposed metal (including in the small gap).

Turning now to FIG. 2B, the printed mask 108 is then removed. Removal of the printed mask 108 may be done by a variety of techniques including using organic solvents such as tetrahydrofuran (THF). While the printed mask 108 is removed in solvent, the monolayer mask 112 is not removed as it is bound to the thin film layer 102.

Next, the monolayer mask 112, now patterned with a dimension smaller than the printed pixel size, is used to etch the underlying thin film layer 102. Etching removes portions of the thin film layer 102 not covered by the monolayer mask 112. The etching may be accomplished using a variety of acids and solvents common in thin film semiconductor processing. After the etching of the thin film layer 102, the monolayer mask 112 may be removed using an oxygen plasma. The adhesion layer 104 is then etched. Finally, as shown in FIG. 2C, the monolayer mask 112 is removed. Optionally, the adhesion layer 104 could be etched before removing the monolayer 112.

The process described above allows for the formation of small features, for example, a gate 114 having a feature size smaller than the minimum spot size of an ink jetted wax droplet, to be created between adjacent lines in a printed pattern. In some cases, if fine features are required over large areas to form structures such as gate electrodes, the printed mask must cover large areas of the film that is subsequently etched. This may be problematic in some applications where it is difficult to achieve pinhole-free coverage of printed masks over relatively large areas.

The process described above applies to thin films for which monolayer masks bond tightly to, which, in practice, include gold, gallium arsenide, copper and silver. Other mask layers can be used for different classes of materials. For example, alkyltrichlorosilanes can be used for silicon oxide and phosphoric acids can be used for aluminum. In some cases, the selective mask is not necessarily a monolayer coating, but is a polymer than can selectively bind to the thin film layer relative to the printed mask.

Figure 3A:
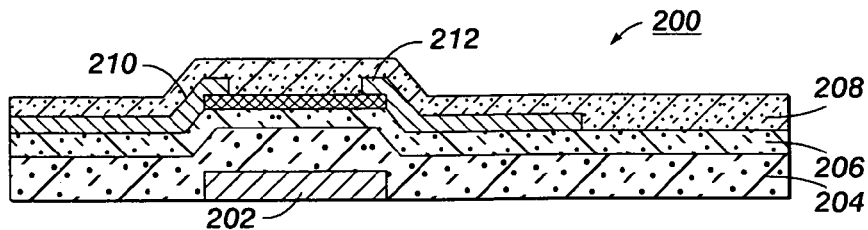
FIGS. 3A-3D show a schematic side view of the formation of a portion of a thin film transistor according to aspects of the exemplary embodiment.

FIGS. 3A-3D illustrate an alternative process in which a monolayer mask is used to etch a passivation dielectric layer to form a via hole in a TFT structure. With reference to FIG. 3A, ae begin with a TFT 200 having a gate metal 202, a gate dielectric layer 204, a semiconductor layer 206, a passivation dielectric layer 208, and a pair of TFT contacts (i.e., source and drain) 210, 212.

Figure 3B:
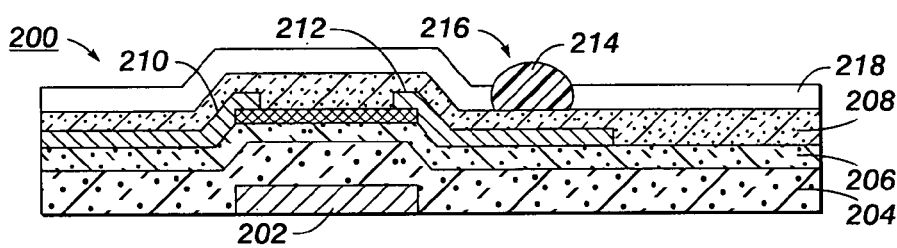
Figure 3C:
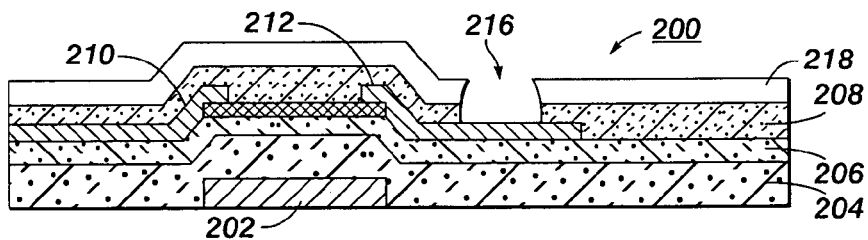
Figure 3D:
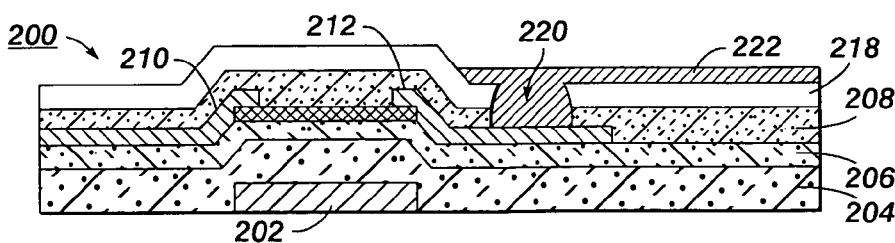

Turning now to FIG. 3B, a printing apparatus, such as the printing apparatus of FIG. 1, ejects droplets of a protective material in a pattern resulting in a patterned protective mask 218 over the prospective via region 216. Next, the TFT structure 200 is dipped in octadecyltrichlorosilane (OTS) to bind a monolayer mask 214 to the passivation dielectric 208. The wax is removed in solvent, and the dielectric 208 is etched (see FIG. 3C). As shown in FIG. 3D, the top metal contact 220 is deposited and wax printing is used to pattern the pixel pad 222.

In an embodiment to form fine features through the use of printed masks and selectively deposited masks, narrow gate structures are formed with associated address lines for use in TFTs in a backplane circuit, as shown in FIGS. 4A-4H, 4J and 5A-5H, 5J. Narrow gate electrodes are advantageous in backplane circuits to reduce the operating capacitance of TFTs and to decrease the resistance of the TFT in its on-state.

Figure 4A:
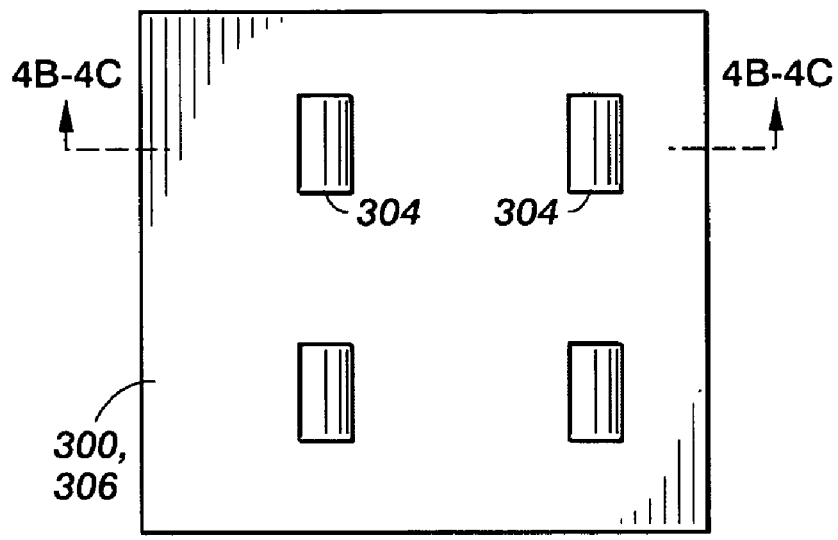
FIGS. 4A-4H, 4J show a side view of the formation of a small gate layer and an address line for a thin film transistor and top view images of the transistor at the corresponding process steps according to other aspects of the exemplary embodiment.
Figure 4B:
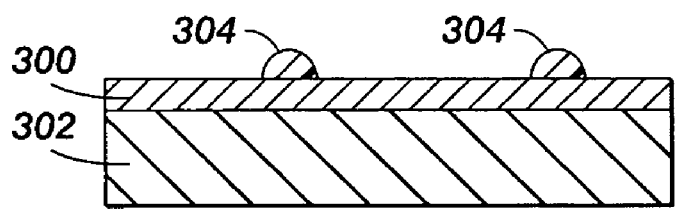

Turning now to FIG. 4B, a thin layer of a metal 300 is deposited onto a substrate 302. The gate metal 300 is typically a thin layer (100 nm) of a metal or alloy such as aluminum, copper, molybdenum-chromium, or a bilayer stack of two metals or alloys, such as a thin layer of palladium or copper, for example 20 nm, on a layer of aluminum, for example 100 nm. The substrate 302 is either a rigid (e.g. glass) or flexible (e.g., PEN, polyimide, thin stainless steel) material.

A first printed mask 304 is deposited onto the substrate to define portions of the gate electrode regions. The printed mask 304 is typically a phase change material deposited from an inkjet printer.

Figure 4C:
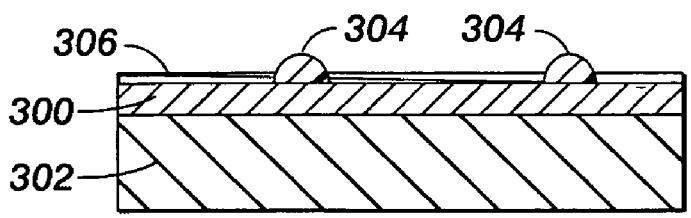

With reference now to FIG. 4C, a selective mask 306 is then deposited onto the substrate 302 such at it adheres strongly to the exposed areas of metal 300 and significantly less or not at all on the first printed mask 304. An example of a selective mask is a self-assembled monolayer that can form an etch resist for the layer of metal; examples include alkanethiols for gold and alkylphosphonic acids for aluminum. The second mask layer 306 could also be a polymer that selectively attaches to the metal layer 300 relative to the first printed mask 304; examples include polyethyleneimine or an organic polymer with reactive thiol functionalities. FIG. 4A shows a top view of the device up to this point in the process.

Figure 4D:
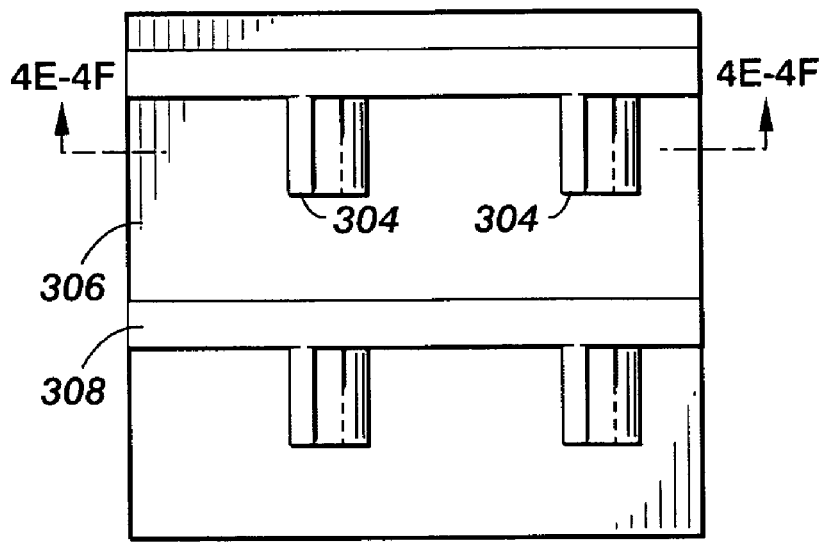
Figure 4E:
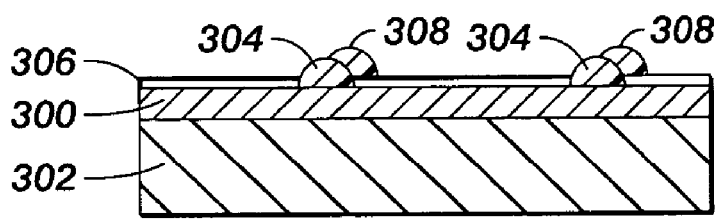

Turning now to FIG. 4E, a third mask layer 308 is printed onto the substrate 302 to define a region of the second mask layer 306 that will be used to form the gate contacts and associated address line. The third mask 308 is printed with accurate registration to the first printed mask 304 to define a region of the second mask 306 that is smaller than the smallest dimension of the first printed mask 304. The third mask 308 also defines the address lines connection the fine features. Typically, a portion of the third mask 308 will overlap the first printed mask 304.

Figure 4F:
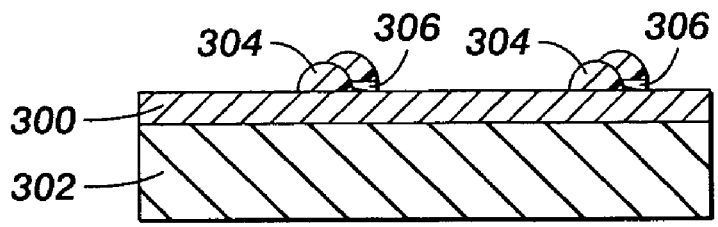
Figure 4G:
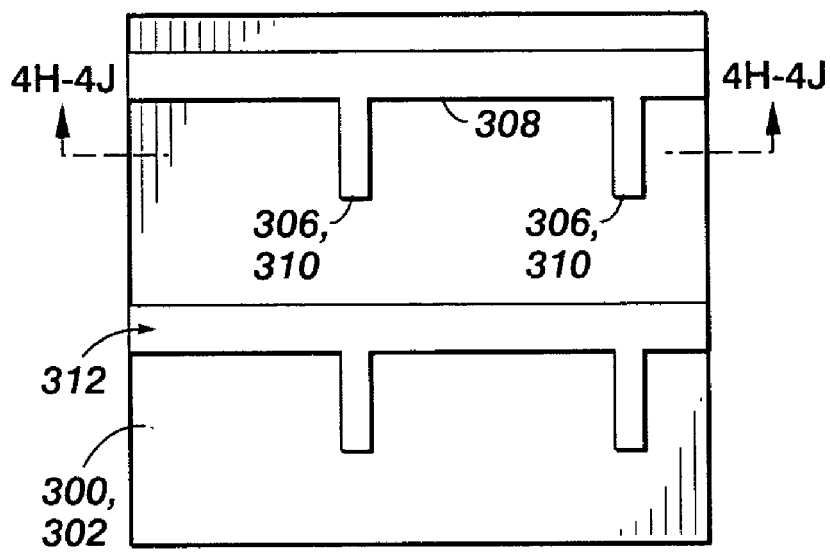

The exposed portions of the second mask layer 306 are then selectively removed relative to the printed mask layers, as shown in FIG. 4F (see FIG. 4D for a top view of the device). Typical processes used to remove the second mask layer 306 include etching with an oxygen plasma or removal using a chemical bath.

Figure 4H:
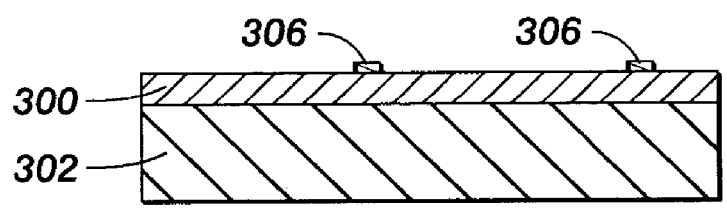

Turning now to FIG. 4H, the printed mask layers 304 and 308 are then selectively removed relative to the remaining portions of the second mask material 306. Typically, removal is accomplished with an organic solvent or aqueous bath. The selectivity of this process is enhanced if the second mask layer 306 is bonded chemically to the thin film 300 as in the case of a self-assembled monolayer.

Figure 4J:
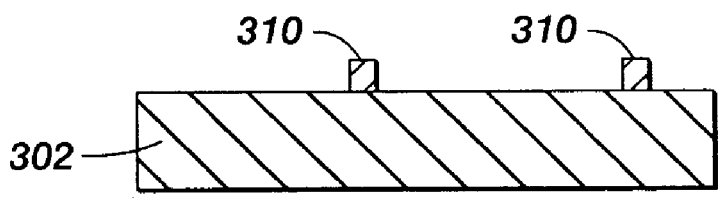

The metal layer 300 is then etched using standard techniques such as wet chemical bath. After etching, the second mask material 306 is removed using one of the processes outlined above. The result is a gate electrode 310 and an address line 312, as shown in FIG. 4J (see FIG. 4G for a top view of the device).

Figure 5A:
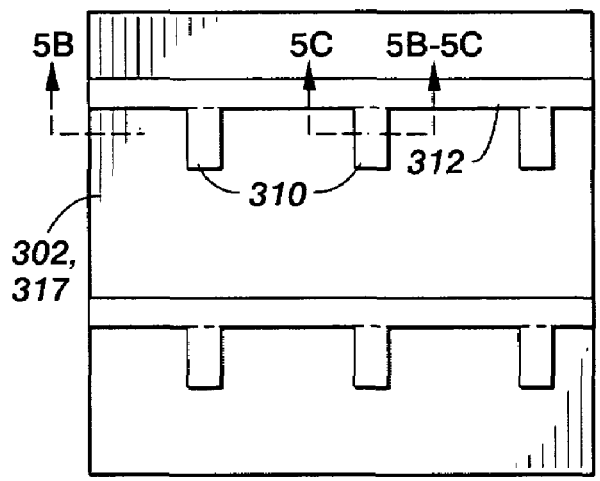
FIGS. 5A-5H, 5J show a side view of the formation of a small gate layer and an address line for a thin film transistor and top view images of the transistor at the corresponding process steps according to other aspects of the exemplary embodiment.
Figure 5B:
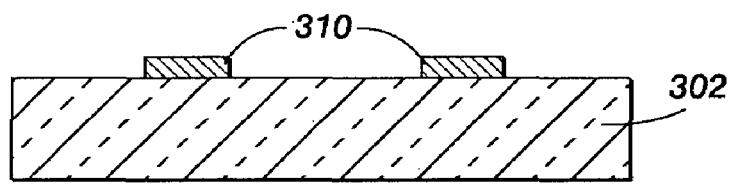

Turning now to FIG. 5A (top view), the finished structure is a plurality of gate electrodes 310 connected by an address line 312 on the substrate 302. These electrode structures 310 can be used to form the first layer of a backplane circuit (see FIG. 5B) The circuit can be finished using standard processing methods to form TFTs with semiconducting materials such as amorphous silicon, nanoparticle dispersions of semiconductors, or organic semiconductors. These methods are known in the prior art.

Figure 5C:
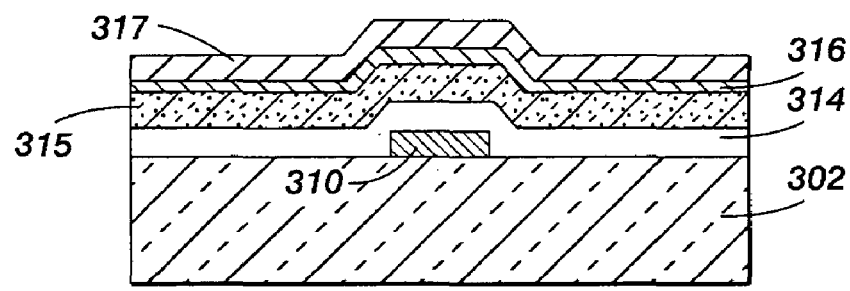

Turning now to FIG. 5C, for an amorphous silicon TFT backplane, the next step is to deposit a series of films, including the gate dielectric layer 314, the semiconductor layer 315 and a doped layer 316. The gate dielectric 314 is typically silicon nitride ($Si_3N_4$), the semiconductor is typically a layer of amorphous silicon (a-Si:H) 315, and the doped layer 316 is typically a layer of doped amorphous silicon ($n^+$-Si). A thin layer of metal 317, typically aluminum or chrome or a bilayer of aluminum and a thin layer of another metal, such as titanium tungsten or an alloy, is then deposited on these layers.

Figure 5D:
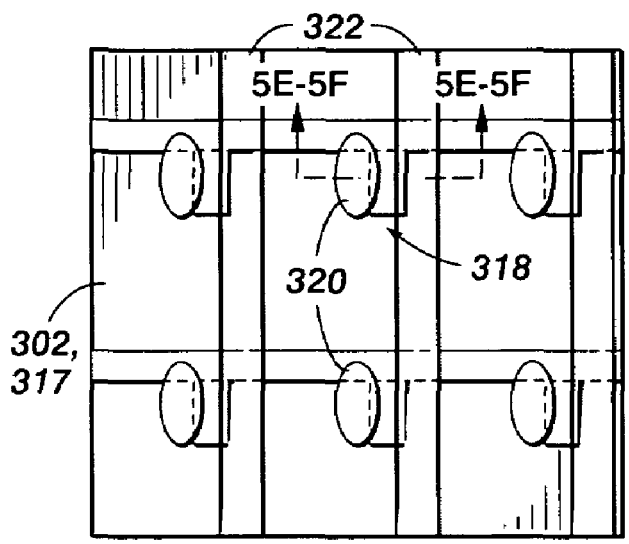
Figure 5E:
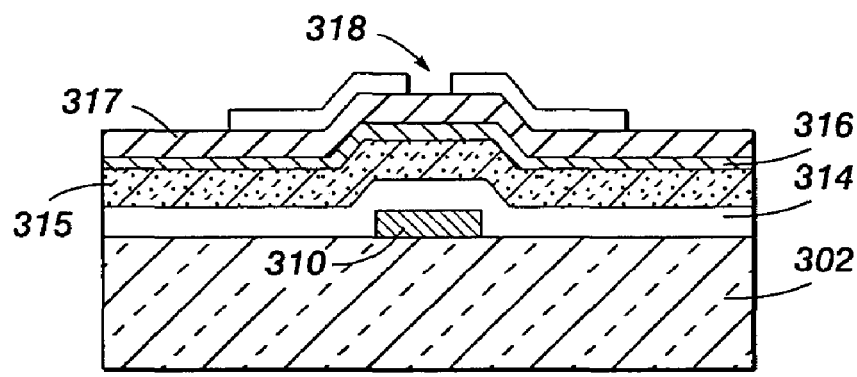
Figure 5F:
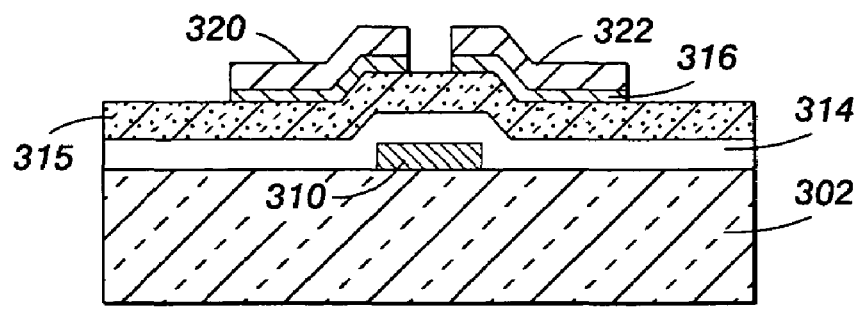
Figure 5G:
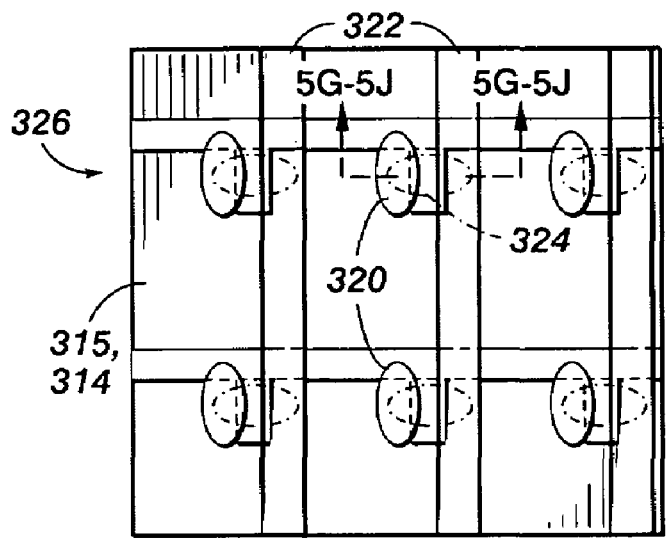
Figure 5H:
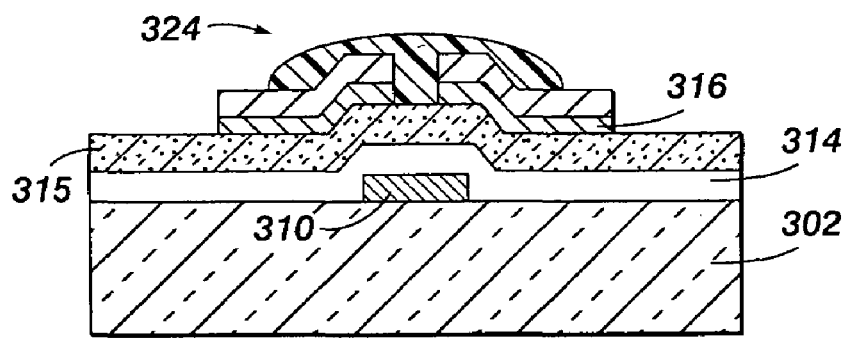
Figure 5J:
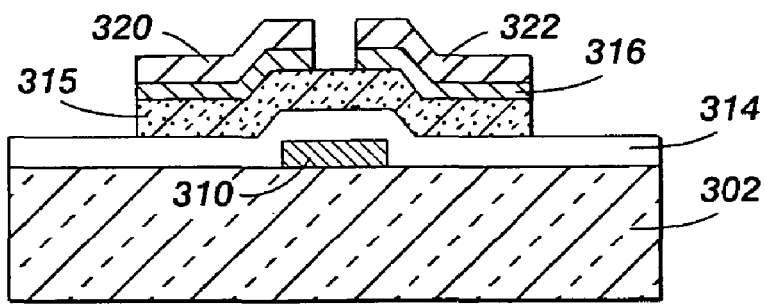

As illustrated in FIGS. 5D-5F, a standard patterning method such as photolithography or digital printing of an etch mask 318 is used to form an etch mask for the source and drain electrodes 320, 322 and associated address line 340. The source and drain metal is then etched along with the underlying doped amorphous silicon 316. Turning now to FIGS. 5G, 5H, and 5J, the first mask 318 is removed and subsequently another mask 324 is then deposited to protect the semiconducting material in the channel region (i.e. between source and drain contacts 320, 322 and over the gate electrode 310), and the amorphous silicon is etched away outside of the mask. The result is a plurality of finished TFTs 326 and thus a portion of the backplane circuit.

In another embodiment, narrow contact structures can be formed to fabricate the source, drain and address line of TFTs in a backplane circuit.

Figure 6A:
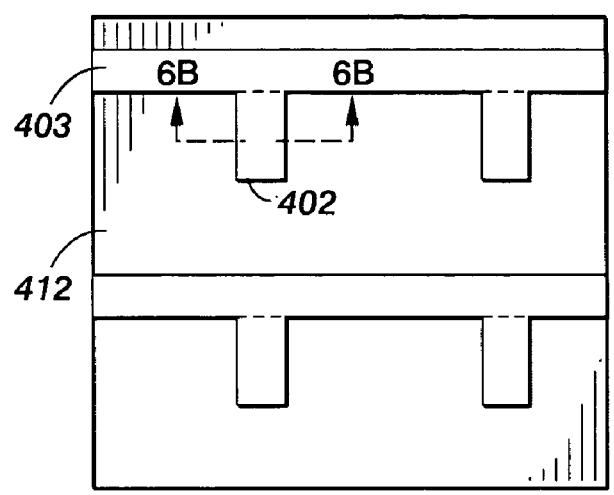
FIGS. 6A-6H, 6J-6N, 6P-6Q show a side view of the formation of a fine feature source and drain layer and an address line for a thin film transistor and top view images of the transistor at the corresponding process steps according to other aspects of the exemplary embodiment.
Figure 6B:
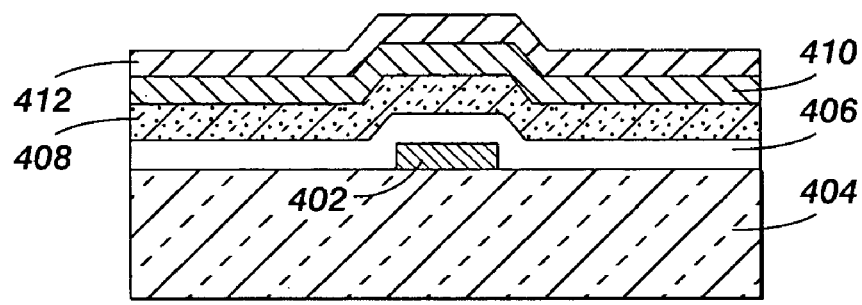

Turning now to FIGS. 6A (top view) and 6B (side view), initially, gate electrodes 402 and an associated address line 403 are defined on a substrate 404, using a processing technique such as photolithography or printing of an etch mask. The gate metal is typically a thin layer (100 nm) of a metal, such as aluminum, or an alloy of metals, such as molybdenum and chromium. The substrate 404 is either a rigid (e.g. glass) or flexible (e.g. PEN, polyimide thin stainless steel) material. Second, the gate dielectric 406, typically silicon nitride, is deposited followed by a layer of amorphous silicon 408 and a layer of doped amorphous silicon 410. A thin layer of metal 412, typically aluminum or chrome or a bilayer of aluminum or gold or copper and another metal or alloy, such as titanium tungsten, is then deposited on these layers.

Figure 6C:
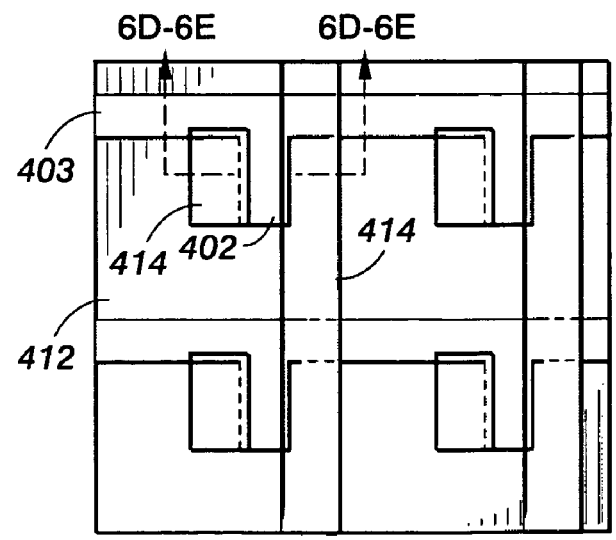
Figure 6D:
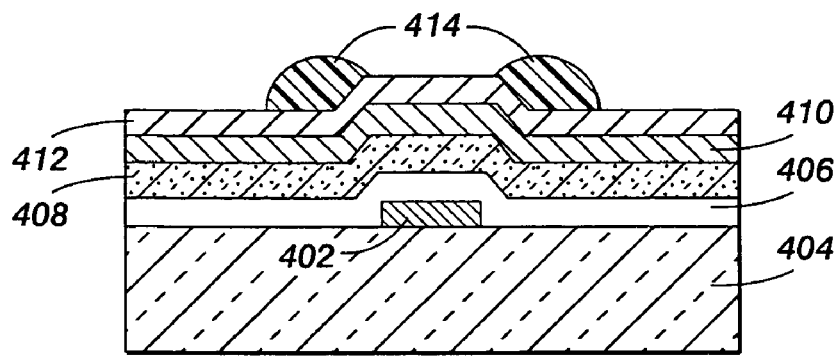

Turning now to FIG. 6D, a first printed mask 414 is then deposited onto the substrate 404 to form the first portion of the mask to pattern a subsequently deposited mask layer. This printed mask 414 is typically a phase change material such as a wax. The first printed mask 414 is printed with accurate registration to the underlying gate electrode structure (see FIG. 6C for a top view)

Figure 6E:
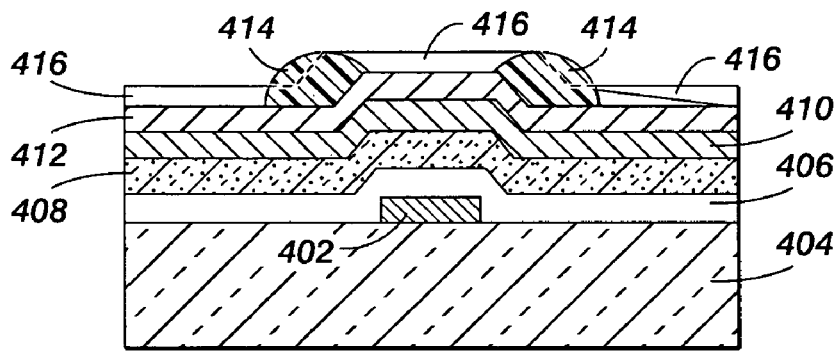

As shown in FIG. 6E, a second mask layer 416 is then selectively deposited onto the substrate 404 such that it primarily covers the metal layer 412 and insignificantly or not at all covers the first printed mask 414. In some cases the second mask layer 416 is a self-assembled monolayer that can form an etch resist for the layer of metal 412. Some examples include alkanethiols for copper and alkylphosphonic acids for aluminum. The second mask layer could also be a polymer that selectively attaches to the metal layer relative to the first printed mask. Some examples include polyethyleneimine or an organic polymer with reactive thiol functionalities.

Figure 6F:
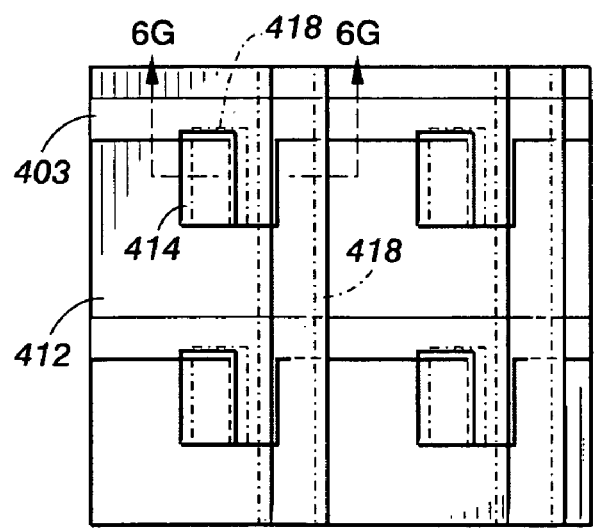
Figure 6G:
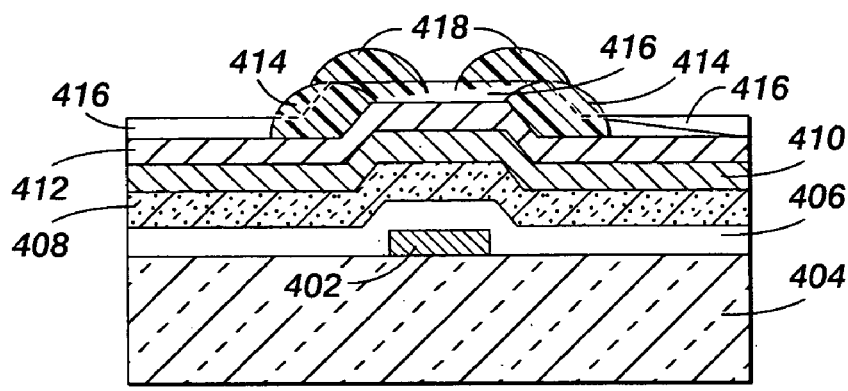

With reference now to FIG. 6G, a third mask layer 418 is printed onto the substrate to define a region of the second mask layer 416 that will be used to form the source and drain contacts and associated address line 440. The third mask 418 is printed with accurate registration to the first printed mask 414 to define a region of the second mask 416 that is smaller than the smallest dimension of the printed mask. In some cases the distance between the regions defined by the overlap of the first printed mask 414 and second printed mask 416 (third mask 418) is smaller than the size of the smallest possible printed mask.

Figure 6H:
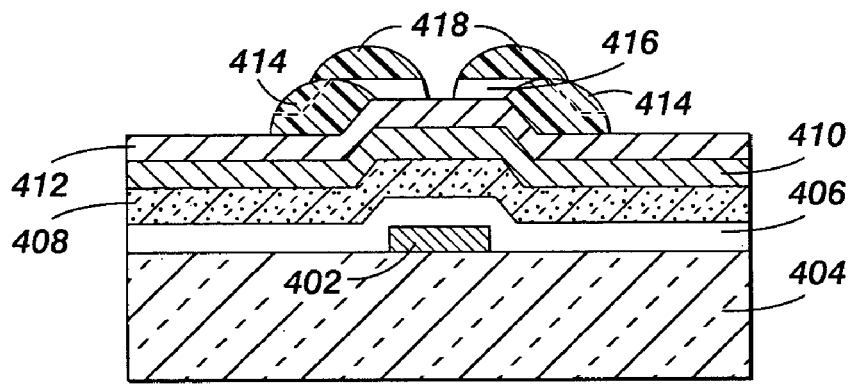

As shown in FIG. 6H, the exposed portions of the second mask layer 416 are then selectively removed relative to the printed mask layers (see FIG. 6F for a top view). Typical processes used to remove the second mask layer 416 include etching with an oxygen plasma or etching using a solvent.

Figure 6J:
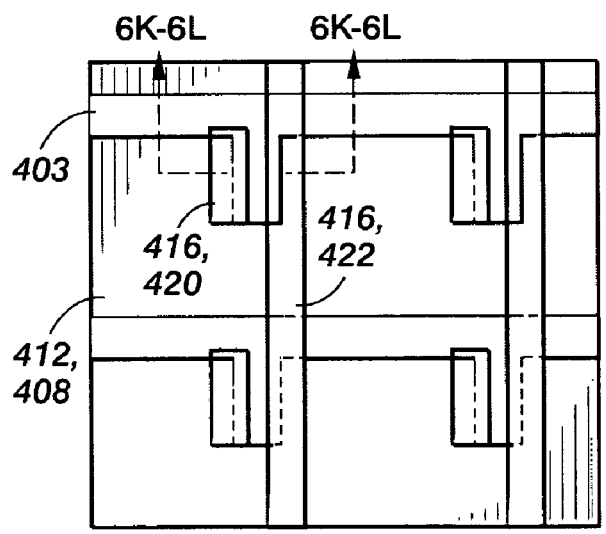
Figure 6K:
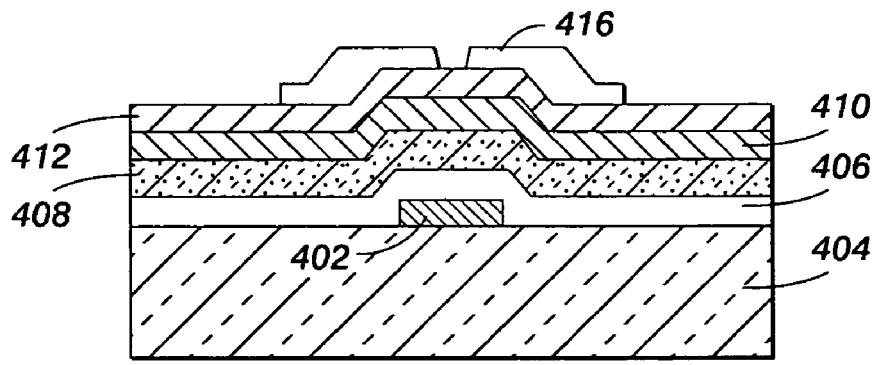

Turning now to FIG. 6K, the printed mask layers 414 and 418 are then selectively removed relative to the remaining portions of the second mask material 416. Typically, removal is accomplished with an organic solvent or aqueous bath. The selectivity of this process is enhanced if the second mask layer 416 is bonded chemically to the substrate 404 as in the case of a self-assembled monolayer.

Figure 6L:
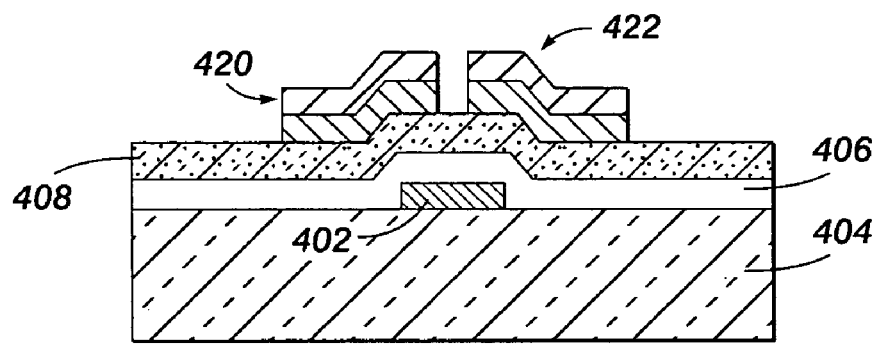

The metal layer 412 is then etched using standard techniques such as wet chemical bath (see FIG. 6L). After etching, the second mask material 416 is removed using one of the processes outlined above, defining the source and drain contacts 420, 422 and associated address line 423 for the TFT (see FIG. 6J for a top view). At this stage, the doped amorphous silicon layer may be removed using the remaining metal 420, 422, and 423 as a mask with a conventional etching process.

Figure 6M:
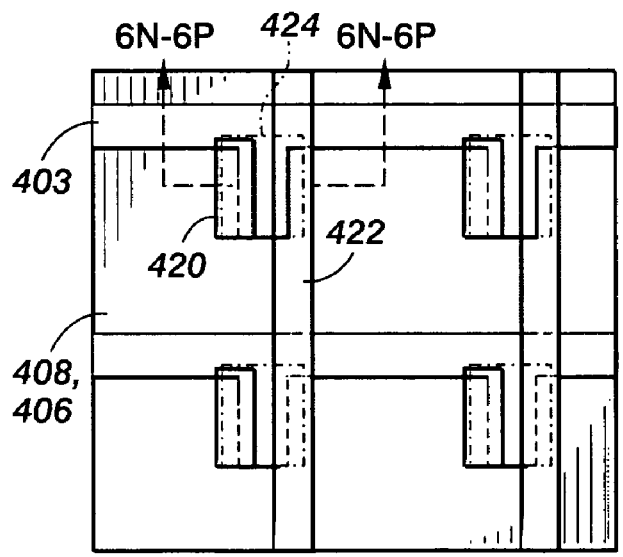
Figure 6N:
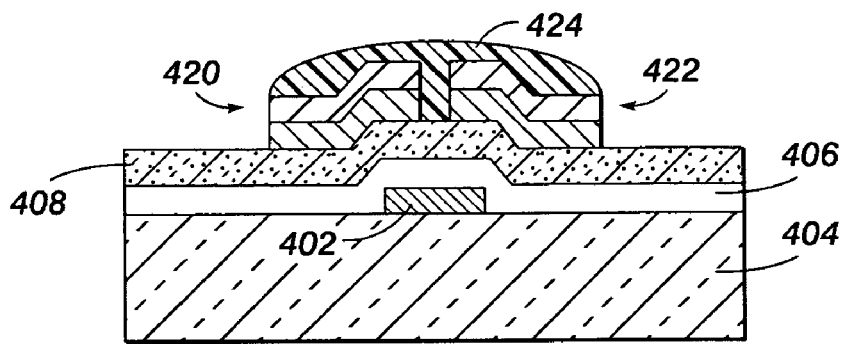

A fourth mask 424 is then deposited to define the a-silicon layer of each TFT, as shown in FIG. 6N (see FIG. 6M for a top view).

Figure 6P:
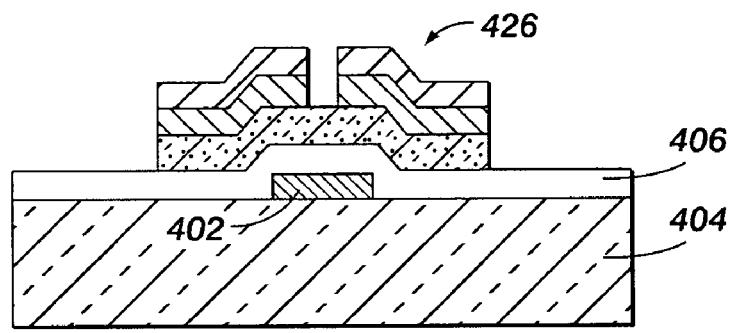

The a-silicon is then etched using standard processing methods such as wet or dry chemical etching and the fourth mask layer 424 is removed, as shown in FIG. 6P.

Figure 6Q:
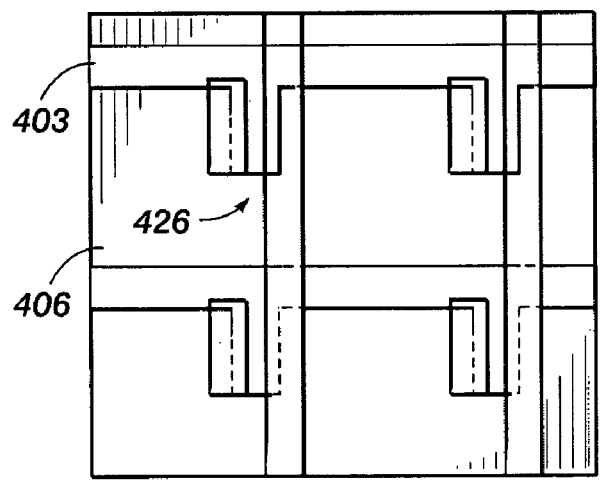

The resulting structure is an array of TFTs 426 on a substrate with associated address lines in columns and rows (see FIGS. 6P and 6Q). Subsequent processing is required to form the final backplane circuit structure (e.g., to form interconnects to pixel electrodes and sensors). These steps are well known in the prior art.

Figure 7A:
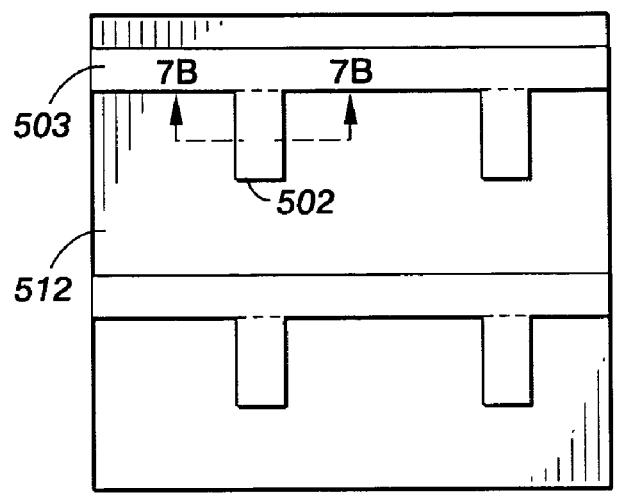
FIGS. 7A-7H, 7J-7N show a side view of the formation of a fine feature source and drain layer and an address line for a thin film transistor and top view images of the transistor at the corresponding process steps according to yet other aspects of the exemplary embodiment.
Figure 7B:
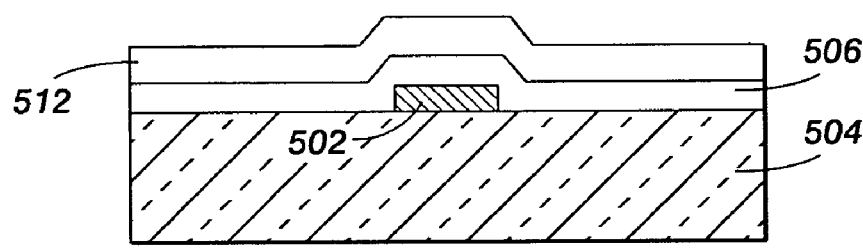

A similar process can be used to form an array of organic TFTs, as outlined in FIGS. 7A-7H, 7J-7N. Turning now to FIGS. 7A (top view) and 7B (side view) initially, gate electrodes 502 and an associated address line 503 are defined on a substrate 504, using a processing technique such as photolithography or printing of an etch mask. The gate metal is typically a thin layer (100 nm) of a metal, such as aluminum, or an alloy of metals, such as molybdenum and chromium. The substrate 504 is either a rigid (e.g. glass) or flexible (e.g. PEN, polyimide thin stainless steel) material. Second, the gate dielectric 506, typically a vapor-deposited dielectric such as silicon nitride or a polymeric dielectric such as cross-linked poly(vinylphenol) or polyimide or cross-linked benzocyclobutene, is deposited. The layer 512 used for the source and drain and associated address line layer is then deposited. Typically, this layer is a thin film of a metal, such as gold or silver with an optional thin, for example less than 10 nm, adhesion layer of titanium or chromium.

Figure 7C:
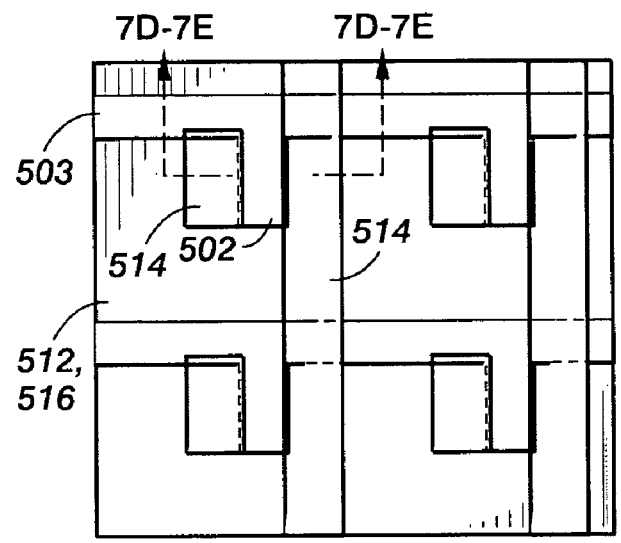
Figure 7D:
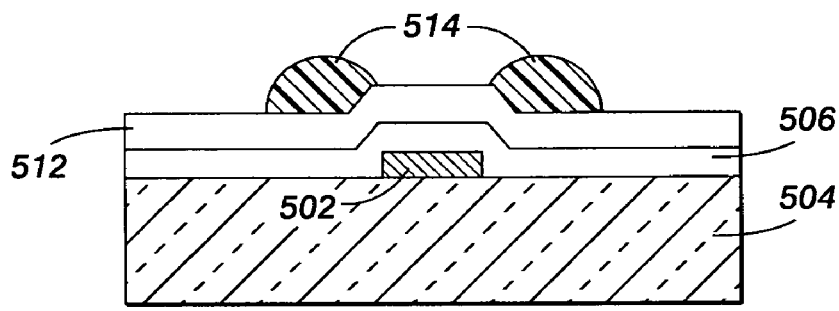

With reference to FIG. 7D, a first printed mask 514 is then deposited onto the substrate to form the first portion of the mask to pattern a subsequently deposited mask layer. This printed mask 514 is typically a phase change material such as a wax.

Figure 7E:
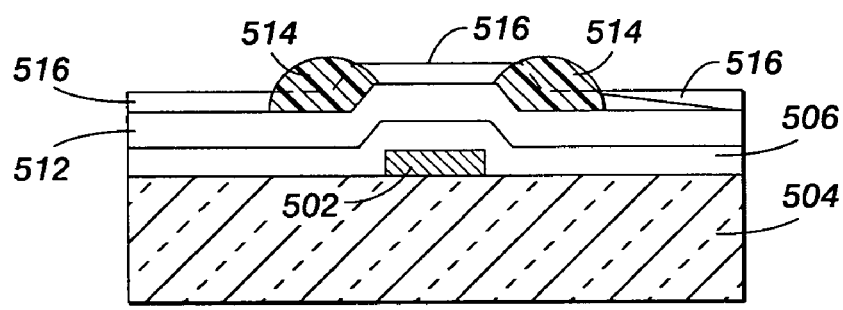
Figure 7F:
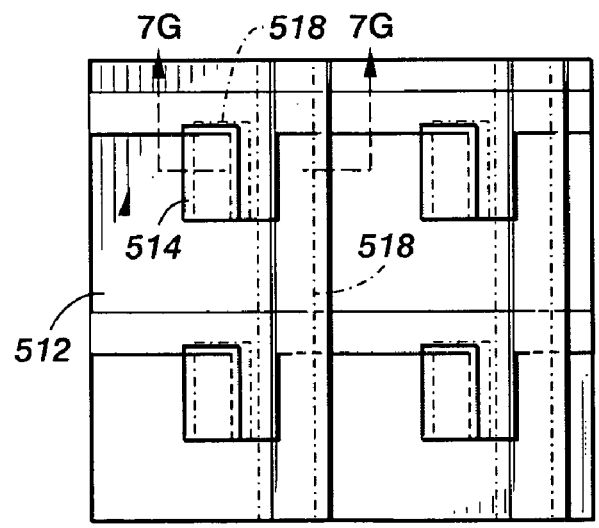

As shown in FIG. 7E, a second mask layer 516 is then selectively deposited onto the substrate 504 such that it primarily covers the metal layer 512 and insignificantly or not at all covers the first printed mask 514 (see FIG. 7C for a top view). In some cases the second mask layer 516 is a self-assembled monolayer that can form an etch resist for the layer of metal 512. Some examples include alkanethiols for copper and alkylphosphonic acids for aluminum. The second mask layer could also be a polymer that selectively attaches to the metal layer relative to the first printed mask. Some examples include polyethyleneimine or an organic polymer with reactive thiol functionalities.

Figure 7G:
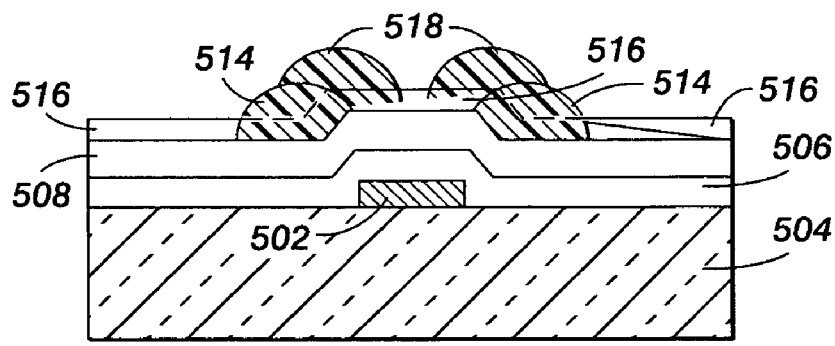

Turning now to FIG. 7G, a third mask layer 518 is printed onto the substrate to define a region of the second mask layer 516 that will be used to form the source and drain contacts and associated address line (see FIG. F for a top view). The third mask 518 is printed with accurate registration to the first printed mask 514 to define a region of the second mask 516 that is smaller than the smallest dimension of the printed mask. In some cases the distance between the regions defined by the overlap of the first printed mask 514 and second printed mask (third mask 518) is smaller than the size of the smallest possible printed mask.

Figure 7H:
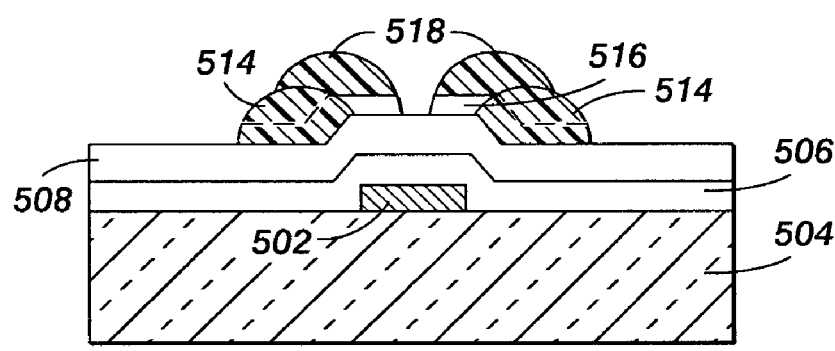

The exposed portions of the second mask layer 516 are then selectively removed relative to the printed mask layers, as shown in FIG. 7H. Typical processes used to remove the second mask layer 516 include etching with an oxygen plasma or etching using a solvent.

Figure 7J:
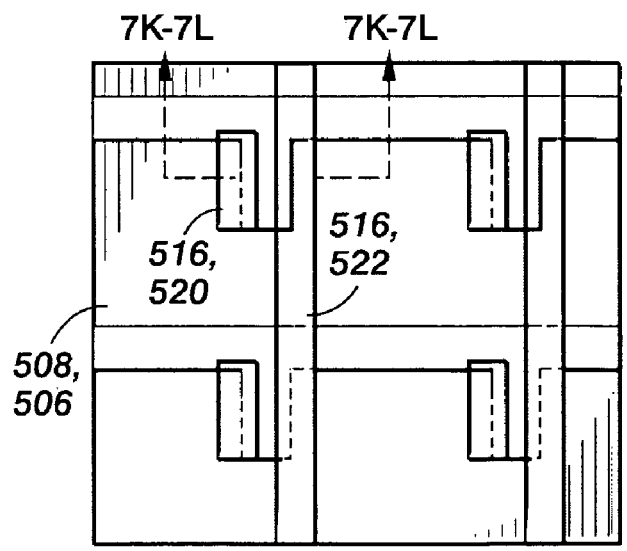
Figure 7K:
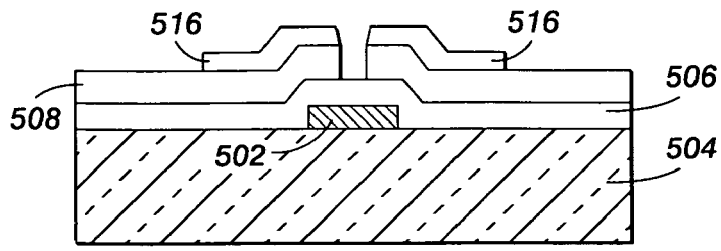
Figure 7L:
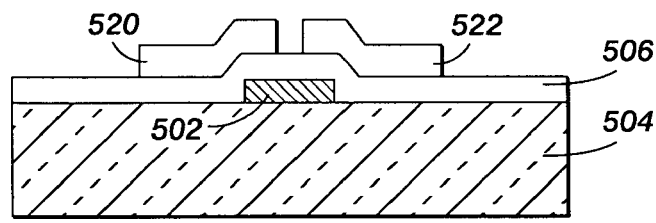

With reference now to FIG. 7K, the printed mask layers 514 and 518 are then selectively removed relative to the remaining portions of the second mask material 516 (see FIG. 7J for a top view). Typically, removal is accomplished with an organic solvent or aqueous bath. The selectivity of this process is enhanced if the second mask layer 516 is bonded chemically to the substrate 504 as in the case of a self-assembled monolayer.

The metal layer 512 is then etched using standard techniques such as wet chemical bath. After etching, the second mask material 516 is removed using one of the processes outlined above, defining the source and drain contacts 520, 522 for the TFT and an associated address line 524 (see FIG. 7L).

Figure 7M:
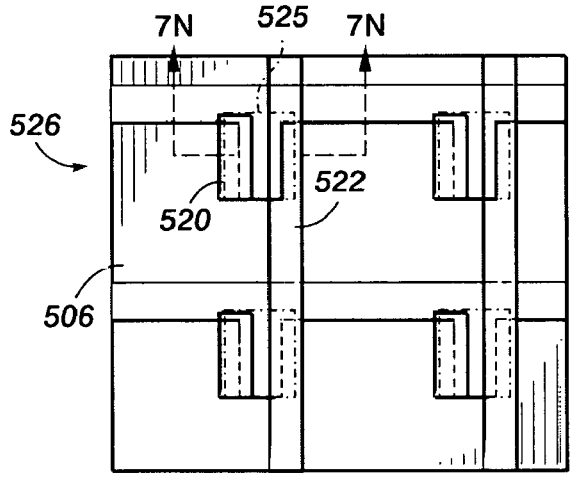
Figure 7N:
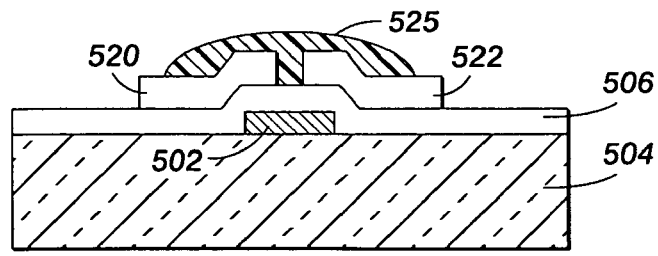

An organic semiconducting layer, such as pentacene or a poly(thiophene), is then deposited onto the substrate 525, as shown in FIG. 7N. It is advantageous if the organic semiconductor can be deposited by jet printing from a solvent directly in the desired pattern over the gate electrode and within the source and drain electrode region. In some cases, a surface treatment, such as attachment of a self-assembled monolayer of an alkyltrichlorosilane, may be applied to the gate dielectric prior to deposition of the semiconducting layer.

The resulting structure is an array of TFTs 526 on a substrate with associated address lines in columns and rows (see FIG. 7M). Subsequent processing is required to form the final backplane circuit structure (e.g., to form interconnects to pixel electrodes and sensors). These steps are well known in the prior art.

Although in these processes, the source and drain electrodes and associated address line are formed subsequent to the formation of the gate electrode and its associated address line, other structures are possible. In some cases, certain steps described above can be performed on an initial metal layer and the TFT is subsequently formed in a top gate geometry. Process steps to form such structures are known.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A method of patterning a feature on a substrate, the method comprising:
    depositing a thin film layer on a substrate;
    printing a first mask to form a fine feature wherein the first printed mask has a minimum dimension and the fine feature is a gap with a distance smaller than the minimum; dimension of the first printed mask:
    depositing a second mask around the first mask and on top of the thin film layer;
    printing a third mask registered to the first mask to define a region of the second mask that is smaller than the smallest region of the first printed mask;
    removing the exposed portions of the second printed mask;
    removing the first and third printed masks relative to the remaining portions of the second printed mask; and
    removing areas of the thin film layer not protected by the remaining second printed mask.

2. The method defined in claim 1 wherein the thin film layer comprises a metal or an alloy or a dielectric.

3. The method defined in claim 1 wherein the first and third printed masks comprise a phase change material.

4. The method defined in claim 1 wherein the second mask comprises a material that selectively attaches to the thin film layer.

5. The method defined in claim 4 wherein the material comprises a monolayer.

6. A method of fabricating an electronic device with fine features, the method comprising:
    depositing a thin film layer on a substrate;
    printing a first mask to form a fine feature wherein the first printed mask has a minimum dimension and the fine feature is a gap with a distance smaller then-the than the minimum of the first printed mask; depositing a second mask around the first printed mask and on top of the thin film layer;
    printing a third mask registered to the first printed mask to define a region of the second mask that is smaller than the smallest region of the first printed mask;
    removing the exposed portions of the second printed mask;
    removing the first and third printed masks relative to the remaining portions of the second printed mask;
    removing portions of the thin film layer not protected by the second printed mask;
    removing the remaining portions of the second printed mask; and
    forming at least one electrical component of an electronic device.

7. The method defined in claim 6 wherein the thin film layer comprises a metal or an alloy or a dielectric.

8. The method defined in claim 6 wherein the first and third printed masks comprise a phase change material.

9. The method defined in claim 6 wherein the second mask comprises a material that selectively attaches to the thin film layer.

10. The method defined in claim 9 wherein the material comprises a monolayer.

11. The method of claim 6 where the electronic device comprises an amorphous silicon thin film transistor or an organic thin film transistor.

12. A method of making a portion of a thin film transistor array, the method comprising:
    depositing a thin film layer on a substrate;
    printing a first mask to form a fine feature wherein the first printed mask has a minimum dimension and the fine feature is a gap with a distance smaller than the minimum of the first printed mask;
    depositing a second mask around the first printed mask and on top of the thin film layer;
    printing a third mask registered to the first printed mask to define a region of the second printed mask that is smaller than the smallest region of the first printed mask;
    removing the exposed portions of the second printed mask;
    removing the first and third masks relative to the remaining portions of the second printed mask;
    removing regions of the thin film layer not protected by the second printed mask; and
    removing the remaining portions of the second printed mask.

13. The method defined in claim 12 wherein the portion of the thin film transistor array comprises the gate electrode region for a thin film transistor and an address line that connects the gate electrode region to other gate electrode regions of the thin film transistor array.

14. The method defined in claim 13 wherein the gate electrode and the address line are co-planar.

15. The method defined in claim 12 wherein the portion of the thin film transistor array comprises the source and drain electrodes for a thin film transistor and an address line that connects one of the source or drain electrodes to the other of the electrodes on the thin film transistor array.

16. The method defined in claim 12 wherein the thin film layer comprises a metal, an alloy, or a dielectric.

17. The method defined in claim 12 wherein the first and third printed masks comprise a phase change material.

18. The method defined in claim 12 wherein the second mask comprises a material that selectively attaches to the thin film layer.

19. The method defined in claim 18 wherein the material comprises a monolayer.

* * * * *